United States Patent
Graef (10) Patent No.: US 9,544,090 B2
(45) Date of Patent: Jan. 10, 2017

(54) HARD INPUT LOW DENSITY PARITY CHECK DECODER

(75) Inventor: Nils Graef, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1634 days.

(21) Appl. No.: 12/750,871

(22) Filed: Mar. 31, 2010

(65) Prior Publication Data

US 2011/0246862 A1 Oct. 6, 2011

(51) Int. Cl.
| G06F 11/00 | (2006.01) |
| H04L 1/00 | (2006.01) |
| H03M 13/11 | (2006.01) |
| H03M 13/00 | (2006.01) |

(52) U.S. Cl.
CPC ........ *H04L 1/0057* (2013.01); *H03M 13/1108* (2013.01); *H03M 13/6502* (2013.01); *H04L 1/0045* (2013.01)

(58) Field of Classification Search
CPC .................................................. H04L 1/0057
See application file for complete search history.

(56) References Cited

U.S. PATENT DOCUMENTS

| 7,587,658 B1* | 9/2009 | Tong et al. .................... 714/785 |
| 2006/0085720 A1* | 4/2006 | Tran et al. ..................... 714/758 |
| 2006/0161830 A1* | 7/2006 | Yedidia et al. ................ 714/758 |
| 2006/0190797 A1* | 8/2006 | Xin .............................. 714/758 |
| 2008/0052594 A1* | 2/2008 | Yedidia et al. ................ 714/758 |
| 2009/0164874 A1* | 6/2009 | O'Neill et al. ................ 714/785 |
| 2009/0282319 A1* | 11/2009 | No et al. ....................... 714/780 |

* cited by examiner

*Primary Examiner* — Christopher McCarthy (57) ABSTRACT

A hard input low density parity check decoder is provided that shares logic between a bit-flipping decoder and a syndrome calculator. The hard-decision decoder decodes one or more error-correcting (EC) codewords and comprises a bit-flipping decoder that flips one or more bit nodes connected to one or more unsatisfied parity checks; and a syndrome calculator that performs a parity check to determine whether the bit-flipping decoder has converged on a valid codeword, wherein the bit-flipping decoder and the syndrome calculator share one or more logic elements. The decoder optionally includes means for updating a parity check equation of each flipped bit. Error-correcting (EC) codewords are decoded by flipping one or more bit nodes connected to one or more unsatisfied parity checks; and updating one or more parity check equations associated with the one or more bit nodes each time the one or more bit nodes are flipped. The parity check equations are updated whenever a bit is updated. The exemplary method terminates based on a predefined syndrome output.

22 Claims, 4 Drawing Sheets

$$H = \begin{bmatrix} H_{LAYER1} \\ H_{LAYER2} \\ H_{LAYER3} \\ H_{LAYER4} \end{bmatrix}$$

FIG. 3B

$$H_{LAYER1} = \begin{bmatrix} I_{1,1} & \cdots I_{1,11} & 0_{1,12} & \cdots & 0_{1,22} & \cdots 0_{1,1365} & \cdots 0_{1,1375} \\ 0_{2,1} & \cdots 0_{2,11} & I_{2,12} & \cdots & I_{2,22} & \cdots 0_{2,1365} & \cdots 0_{2,1375} \\ \vdots & \vdots & \vdots & & \vdots & \vdots & \vdots \\ 0_{125,1} & \cdots 0_{125,11} & 0_{125,12} & \cdots & 0_{125,22} & \cdots I_{125,1365} & \cdots I_{125,1375} \end{bmatrix}$$

HARD INPUT LOW DENSITY PARITY CHECK DECODER

BACKGROUND OF THE INVENTION

Field of the Invention

The present invention relates generally to signal processing techniques, and, more particularly, to error-correction encoding and decoding techniques such as low-density parity-check (LDPC) encoding and decoding.

Description of the Related Art

In communicating a data signal from a transmitter to a receiver, noise may be introduced into the signal causing the signal to be distorted upon arrival at the receiver. As a result of this distortion, the receiver might not correctly recover the transmitted information. In such cases, the transmitted signal may need to be retransmitted so that the receiver may have another opportunity to recover the transmitted information. However, resending the transmitted signal increases the amount of time that it takes to provide the transmitted information to the user.

To reduce the frequency of retransmissions, and therefore reduce the amount of time that it takes for the transmitted information to be delivered to the user, the transmitter may encode the transmitted signal using a channel-coding scheme. A channel-coding scheme adds redundant or additional data to the signal to be transmitted. The receiver then uses this redundant or additional data to detect and/or correct errors. If the channel-coding scheme is effective, then the transmitted data may be recovered correctly without retransmitting the data.

One particular channel-coding scheme that has received attention in recent years is low-density parity-check (LDPC) coding. LDPC codes, which are typically defined using parity-check matrices, provide excellent performance that comes relatively close to the Shannon limit. A discussion of LDPC codes and LDPC decoding is presented in Todd K. Moon, "Error Correction Coding: Mathematical Methods and Algorithms." (2005), incorporated by reference herein.

SUMMARY OF THE INVENTION

Generally, a hard input low density parity check decoder is provided that shares logic between a bit-flipping decoder and a syndrome calculator. According to one aspect of the invention, a hard-decision decoder is provided for decoding one or more error-correcting (EC) codewords. The disclosed decoder comprises a bit-flipping decoder that flips one or more bit nodes connected to one or more unsatisfied parity checks; and a syndrome calculator that performs a parity check to determine whether the bit-flipping decoder has converged on a valid codeword, wherein the bit-flipping decoder and the syndrome calculator share one or more logic elements. The decoder optionally also includes means for updating a parity check equation of each flipped bit.

The bit-flipping decoder can be based, for example, on a variation of the Gallagher B algorithm. Generally, the bit-flipping decoder flips a bit if a substantial majority of parity check equations are unsatisfied. The bit-flipping decoder comprises one or more logic gates to perform the bit flipping, such as one or more exclusive OR gates. The shared logic elements may comprise, for example, cross connection circuit elements (such as Barrel shifters), exclusive OR gates and/or memory elements.

According to a further aspect of the invention, one or more error-correcting (EC) codewords are decoded by flipping one or more bit nodes connected to one or more unsatisfied parity checks; and updating one or more parity check equations associated with the one or more bit nodes each time the one or more bit nodes are flipped. The parity check equations are updated whenever a bit is updated. The exemplary method terminates based on a predefined syndrome output.

A more complete understanding of the present invention, as well as further features and advantages of the present invention, will be obtained by reference to the following detailed description and drawings.

DETAILED DESCRIPTION

The present invention provides an improved hard-decision LDPC decoder that shares logic between a bit-flipping decoder, such as a decoder that implements a bit-flipping algorithm similar to the Gallagher B algorithm, and a syndrome calculator. In this manner, the disclosed LDPC decoder exhibits reduced chip area and power consumption when implemented in a chip. According to a further aspect of the present invention, the disclosed syndrome calculator has virtually no latency as the syndrome is constantly being updated, resulting in high throughput and low latency overall of the decoder.

Figure 1:
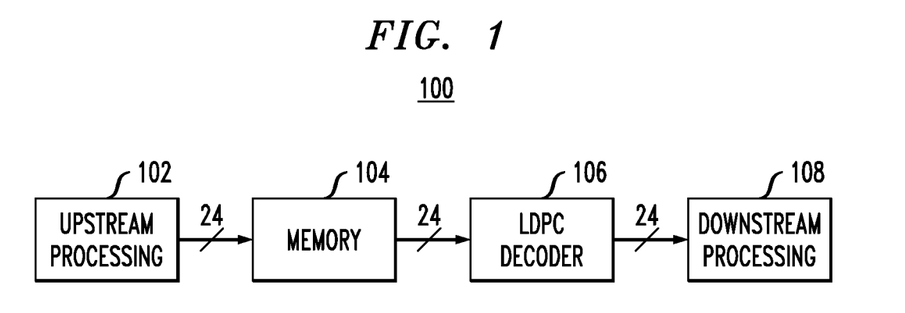
FIG. 1 illustrates a simplified block diagram of a conventional signal-processing receiver that may be used to receive an LDPC-encoded codeword.

FIG. 1 illustrates a simplified block diagram of one implementation of a conventional signal-processing receiver 100 that may be used to receive an LDPC-encoded codeword. Receiver 100 may be implemented in a variety of different applications such as hard-disc drive (HDD) and other storage systems, digital audio broadcast (DAB) systems, and WIFI systems. Receiver 100 receives LDPC-encoded codewords and processes the codewords using upstream processing 102, which may perform, for example, radio-frequency processing, analog-to-digital conversion, equalization, channel detection such as Viterbi detection, or other processing suitable for generating bit values and/or hard-decision bits. The processing performed by upstream processing 102 may depend on the particular application in which receiver 100 is implemented. Suppose for the following discussion that each of the codewords received by receiver 100 has a length of 33,000 bits. Further, suppose that upstream processing 102 outputs the 33,000 bits at a rate of 24 bits per clock cycle to memory 104.

Memory 104 stores all 33,000 bit values, and provides the bit values to LDPC decoder 106 at a rate of 24 bits per clock cycle. The bit values may be provided in an order that is different from the order in which they are received by memory 104. The order in which they are output corresponds to the structure of the LDPC code, and consequently, the order in which they are processed by LDPC decoder 106. To provide the bit values in a different order, memory 104 is implemented with logic that enables it to determine which bit values to provide during each clock cycle.

Exemplary LDPC decoder 106 decodes the bit values in the order that they are received from memory 104, and, if decoding is successful, LDPC decoder 106 outputs a hard-decision bit for each of the 33,000 bits of the codeword at a rate of 24 hard-decision bits per clock cycle. The hard-decision bits are processed by downstream processing 108, which may perform, for example, removing the redundant bits and only forwarding the information bits.

Figure 2:
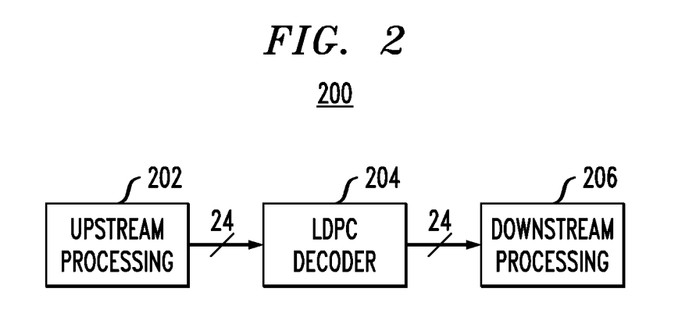
FIG. 2 illustrates a simplified block diagram of a signal-processing receiver according to one embodiment of the present invention.

FIG. 2 illustrates a simplified block diagram of a signal-processing receiver 200 according to one embodiment of the present invention. Receiver 200 has upstream processing 202 and downstream processing 206, which may be implemented in a manner similar to that of the equivalent processing of signal-processing receiver 100 of FIG. 1. Receiver 200 also has LDPC decoder 204, which is capable of processing bit values, without having to wait until all of the bit values are generated for the current codeword. In this particular embodiment, LDPC decoder 204 is capable of processing the bit values as soon as they are generated by upstream processing 202, and in the order in which they are generated by upstream processing 202. In other embodiments, LDPC decoders of the present invention may process the bit values after some delay, albeit, without having to wait until all of the bit values are generated for the current codeword.

In receiver 200, all 33,000 bit values are provided from upstream processing 202 to LDPC decoder 204 in 1,375 clock cycles (i.e., 33,000 values/24 values per clock cycle). In one embodiment of this invention, it may take 2,750 clock cycles for all 33,000 bit values to be provided from upstream processing 102 to LDPC decoder 106. Upstream processing 102 provides all 33,000 bit values to memory 104 during 1,375 clock cycles, and memory 104 provides all 33,000 bits to LDPC decoder 106 during the next 1,375 clock cycles. Since LDPC decoder 204 receives the bit values in 1,375 clock cycles, as opposed to 2,750 clock cycles, receiver 200 may have a lower latency than receiver 100. Further, since receiver 200 does not implement bit memory, the chip area occupied by receiver 200 may be smaller than that of receiver 100.

The order in which the bit values are processed by an LDPC decoder generally depends on the structure of the LDPC code. Conventional LDPC codes do not allow for processing of bit values in the order in which they are output from the upstream processing. Rather, as described above in relation to FIG. 1, conventional receivers store the bit values and provide these values to conventional LDPC decoders in a different order from which they were received. LDPC codes employed by receiver 200, on the other hand, may be structured, as discussed below, such that bit values are processed by LDPC decoder 204 in the order that they are output from the upstream processing.

Figure 3A:
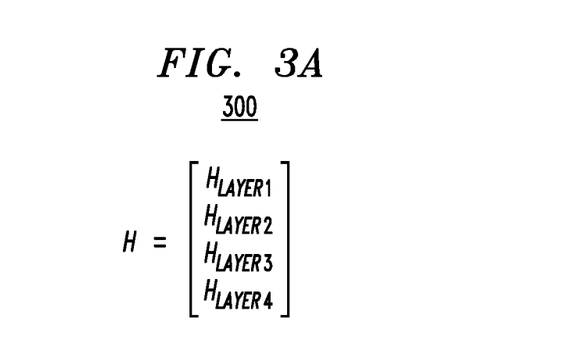
FIG. 3A illustrates a parity-check matrix representation of an LDPC code according to one embodiment of the present invention that may be used to decode codewords by the receiver of FIG. 2.

FIG. 3A illustrates a parity-check matrix representation of an LDPC code 300 according to one embodiment of the present invention that may be used to decode codewords by receiver 200 of FIG. 2. Parity-check matrix 300, commonly referred to as an H-matrix, is composed of (24×24) sub-matrices, each of which may be either (i) a zero matrix, (ii) an identity matrix, or (iii) a circulant that is obtained by cyclically shifting an identity matrix. The (24×24) sub-matrices are arranged in 1,375 block columns and 500 block rows, such that H-matrix 300 comprises (i) 24×1,375=33,000 total columns, each of which corresponds to an $n^{th}$ variable node, where 17 ranges from 1 to 33,000, and (ii) 24×500=12,000 total rows, each of which corresponds to an $m^{th}$ check node, where m ranges from 1 to 12,000.

The sub-matrices are arranged such that the hamming weight $w_r$ for each row is equal to 11 and the hamming weight iv, for each column is equal to four. Further, to support a layered-decoding algorithm, the 500 block rows are divided into four layers ($H_{LAYER1}$, $H_{LAYER2}$, $H_{LAYER3}$, and $H_{LAYER4}$) such that (i) each layer comprises 125 block rows and (ii) each column of the layers has a hamming weight equal to one (i.e., (wc=4)÷4 layers=1 per layer).

Figure 3B:
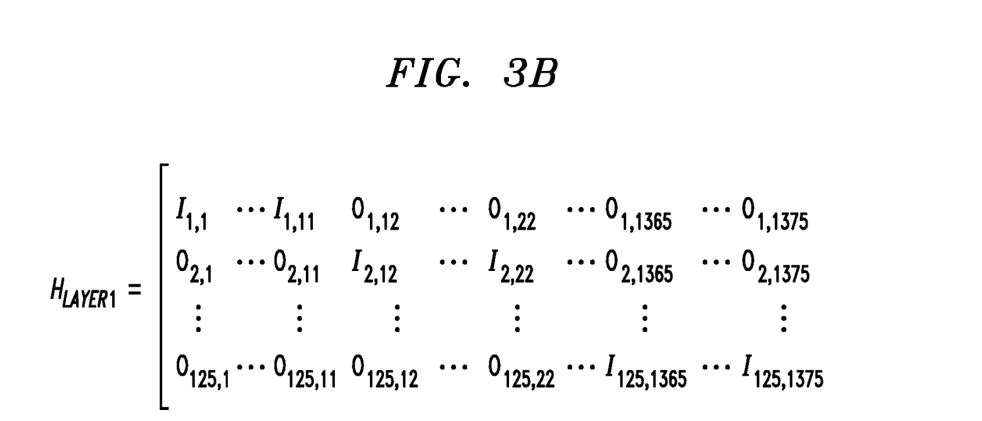
FIG. 3B illustrates an exemplary first layer of the H-matrix of FIG. 3A according to one embodiment of the present invention.

FIG. 3B illustrates an exemplary first layer ($H_{LAYER1}$) of H-matrix 300 according to one embodiment of the present invention. The present invention is not limited, however, to the exemplary first layer ($H_{LAYER\ 1}$) shown in FIG. 3B, as would be apparent to a person of ordinary skill in the art.

The first layer ($H_{LAYER}$ is arranged such that bit values may be processed by the LDPC decoder in the order that they are output from the upstream processing, as discussed below. In the first block row, the (24×24) sub-matrices are arranged such that the $1^{st}$ through $11^{th}$ sub-matrices are identity matrices ($I_{1,1}$ to $I_{1,11}$), and the $12^{th}$ through $1,375^{th}$ sub-matrices are zero matrices ($0_{1,12}$ to $0_{1,1375}$). In the second block row, the sub-matrices are arranged such that the $1^{st}$ through $11^{th}$ sub-matrices are zero matrices ($0_{2,1}$ to $0_{2,11}$), the $12^{th}$ through $22^{nd}$ sub-matrices are identity matrices ($I_{2,12}$ to $I_{2,22}$), and the $23^{rd}$ through $1,375^{th}$ sub-matrices are zero matrices ($0_{1,23}$ to $0_{1,1375}$). This pattern is repeated until the last block row in which the $1^{st}$ through $1,364^{th}$ sub-matrices are zero matrices ($0_{125,1}$ to $0_{125,1364}$) and the $1,365^{th}$ through $1,375^{th}$ sub-matrices are identity matrices ($I_{1,1365}$ to $I_{1,1375}$).

The arrangement of the first layer ($H_{LAYER1}$) may be varied from one embodiment of the present invention to the next to generate different LDPC codes. Various embodiments of the first layer ($H_{LAYER1}$), such as the embodiment of FIG. 3B, may support decoding of bit values as soon as they are generated, and various other embodiments may support decoding of bit values, perhaps with some delay, but without having to wait until all of the bit values are generated.

The arrangement of each of the second through fourth layers ($H_{LAYER2}$–$H_{LAYER4}$) of H-matrix 300 may be obtained by implementing each (24×24) sub-matrix of the second through fourth layers ($H_{LAYER2}$–$H_{LAYER4}$) as a zero matrix, an identity matrix, or a circulant, such that the hamming weight of each layer row is 11 and the hamming weight iv, of each layer column is one. The arrangement of each of the second through fourth layers ($H_{LAYER2}$–$H_{LAYER4}$) of H-matrix 300 may differ from that of the first layer ($H_{LAYER1}$) and may be different from one implementation to the next to generate different LDPC codes. These layers may be made different, for example, by varying the locations of the zero matrices, identity matrices, and circulants. Additionally, one or more of the second through fourth layers ($H_{LAYER2}$–$H_{LAYER4}$) may be arranged in the same manner as the first layer. Note that LDPC H-matrices of the present invention may also be generated by permutating rows and columns of prior-art H-matrices. Typically, the error-correction capabilities of an LDPC matrix of the present invention that is obtained by permutating rows and columns of a prior-art H-matrix is the same as that of the prior-art H-matrix.

Figure 4:
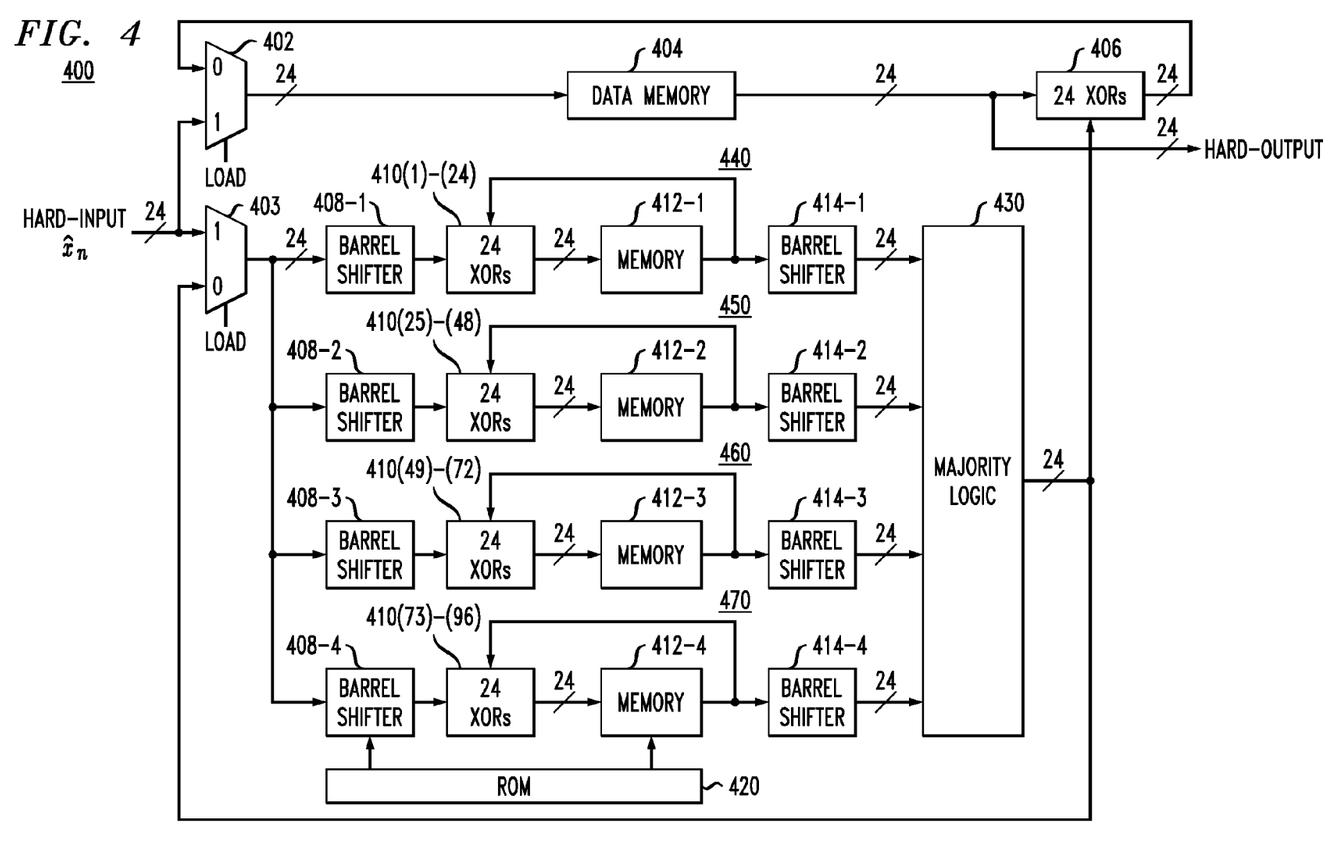
FIG. 4 is a block diagram for an exemplary hard-decision LDPC decoder incorporating features of the present invention.

FIG. 4 is a block diagram for an exemplary hard-decision LDPC decoder 400 incorporating features of the present invention. The exemplary hard-decision LDPC decoder 400 exhibits a parallelization of 24. Thus, in each clock cycle, the decoder 400 receives 24 "hard-input" bits of the exemplary 33,000 bits long received vector. The exemplary hard-decision LDPC decoder 400 shares logic between a bit-flipping decoder, such as a decoder implementing a bit-flipping algorithm similar to the Gallagher B bit-flipping algorithm, and a syndrome calculator.

Generally, syndrome calculators perform a parity check to determine whether the LDPC decoder 400 has converged on a valid codeword. The syndrome calculator of the exemplary hard-decision LDPC decoder 400 updates the 12,000 parity-check equations (i.e., rows) of H-matrix 300 of FIG. 3 each time LDPC decoder 400 processes the H-matrix 300. Decoder 400 processes all four layers in parallel.

In general, if $\hat{x}H^T=0$, where $H^T$ is the transpose of H-matrix 300 of FIG. 3 and $\hat{x}$ is a 33,000-element vector formed from the 33,000 hard-decision bits $\hat{x}_n$, then the LDPC decoder 400 has converged on a valid codeword. If $\hat{x}H^T \neq 0$, then decoding continues until $\hat{x}H^T=0$ or a predefined number of iterations are implemented. The decoding process may terminate before the current iteration of the LDPC decoder 400 is complete. If the decoding process does not end within a predefined number of iterations, then the received codeword has not been properly decoded.

As previously indicated, during each clock cycle of the first iteration, the decoder 400 receives 24 "hard-input" bits, $\hat{x}_n$, each corresponding to one parity-check equation (i.e., row) in each of the four layers of H-matrix 300 of FIG. 3. The 4×24 parity-check equations corresponding to the 24 hard decisions $\hat{x}_n$ are updated using four branches 440, 450, 460, and 470, which perform parity-check updates for layers one through four ($H_{LAYER1}$-$H_{LAYER4}$) of H-matrix 300, respectively.

In each clock cycle, two multiplexers 402, 403 load the received 24 hard-decision bits into a data memory 404 and sent to 4 barrel-shifters 408-1 through 408-4 (each exemplary barrel shifter 408 has 24 inputs and 24 outputs, and 5-bit control input driven by a ROM 420). While barrel shifters 408 are employed in the exemplary embodiment, the present invention can be implemented using any type of crossbar or hard-wired fixed cross-connections, as would be apparent to a person of ordinary skill in the art.

As discussed further below, the barrel-shifters 408, XOR gates 410(1)-410-(96), and the memories 412-1 through 412-4 (such as dual-port register files) are used to calculate the syndrome (which is 12000 bits long). Each of the 4 memories 412 has a width of 24 bits and a depth of 125 words (3000 parity check equations). The two multiplexers 402, 403 can also load feedback values into the data memory 404 and 4 barrel-shifters 408.

In general, first branch 440 performs the parity-check updates for the first 24 rows of H-matrix 300 during the first 11 clock cycles, the updates for rows 25 through 48 during the 12$^{th}$ through 22$^{nd}$ clock cycles, the updates for rows 49 through 72 during the 23$^{rd}$ through 33$^{rd}$ clock cycles, and so on, until all parity-check equations of the first layer of H-matrix 300 have been updated. During the first clock cycle, the first set of 24 hard decisions received corresponds to the first block column (i.e., the first 24 columns) of H-matrix 300. Since the sub-matrix corresponding to the first block row and first block column of H-matrix 300 (i.e., identity matrix $I_{1,1}$) is an identity matrix, the 1$^{st}$ through 24$^{th}$ hard decisions $\hat{x}_n$ of the first set correspond to the 1$^{st}$ through 24$^{th}$ parity-check equations (i.e., rows), respectively. Thus, the first set of hard decisions $\hat{x}_n$ is used to update the first 24 parity-check equations (i.e., rows).

In so doing, the 24 hard decisions $\hat{x}_n$ are applied to a barrel shifter 408-1 that cyclically shifts the set of 24 hard decisions $\hat{x}_n$ that it receives based on a cyclic-shift signal received from, for example, ROM 420. The cyclic-shift signal is based on the cyclic-shift factors of the sub-matrices of the second layer ($H_{LAYER2}$) of H-matrix 300. The 24 cyclically-shifted hard decisions $\hat{x}_n$ are applied to XOR gates 410(1)-(24) along with 24 parity-check bits stored in memory 412-1, such that one hard decision $\hat{x}_n$ and one parity-check bit are applied to each XOR gate 410, to generate 24 updated parity-check bits that are subsequently stored in memory 412-1. The 24 parity-check bits stored in memory 412-1 may be initialized to 0. The output of the memory 412-1 is then applied to a second barrel shifter 414-1.

During the second clock cycle, a second set of 24 hard decisions $\hat{x}_n$ is received that corresponds to the second block column (i.e., columns 25 through 48) of H-matrix 300. Since the sub-matrix corresponding to the first block row and second block column of H-matrix 300 (i.e., identity matrix $I_{1,2}$) is an identity matrix, the 1$^{st}$ through 24$^{th}$ hard decisions $\hat{x}_n$ of the second set correspond to the 1$^{st}$ through 24$^{th}$ parity-check equations (i.e., rows), respectively. Thus, these hard decisions $\hat{x}_n$ are used to update the 24 parity-check bits corresponding to the first 24 rows of H-matrix 300 by applying the 24 hard decisions $\hat{x}_n$ to XOR gates 410(1)-(24) along with the 24 updated parity-check bits stored in the memory 412-1. This process is repeated for the third through 11th clock cycles.

At the end of 1375 clock cycles, all parity check equations have been calculated and their values (0 or 1) are stored in memories 412-1, 412-2, 412-3, 412-4. Note that each of the 33000 information bits is "connected" (or related) to 4 parity check equations. Each information bit is flipped if at least 2 (or 1 or 3) of its 4 parity check equations are violated. This is the bit flipping algorithm similar to the Gallagher bit-flipping algorithm. Note that a parity check equation is said to be "unsatisfied" if the parity check equation value equals 1.

As discussed further below in connection with the discussion of the first iteration, every time an information bit is being flipped, its 4 related parity check equations can be updated at the same time. This notion is an important aspect of the present invention. So instead of recalculating all parity check equations from scratch after each iteration (i.e. after each 1375 clocks), an aspect of this invention immediately updates the parity checks whenever a bit (or up to 24 bits at a time) are updated. This is unlike the Gallagher B algorithm, which recalculates all check equations for each iteration from scratch.

The present invention features faster convergence than the Gallagher B algorithm, because it continuously updates its parity check equations. In particular, aspects of the invention update the equations much more frequently; the parity check equations are updated every clock cycle, while the Gallagher B algorithm updates the parity check equations only once for each iteration, i.e., only every 1375 clock cycles.

Typically, branches 450, 460, and 470 will perform the parity-check (i.e., row) updates in a more random order than that of first branch 440 because the second through fourth layers ($H_{LAYER2}$-$H_{LAYER4}$) of H-matrix 300 might not be arranged in the same pattern as the first layer ($H_{LAYER1}$). For example, as described above, the first set of 24 hard decisions received during the first clock cycle correspond to the first block column (i.e., the first 24 columns) of H-matrix 300. However, these 24 hard decisions might not, depending on the arrangement of the second layer ($H_{LAYER2}$), correspond to the first 24 parity-check equations (i.e., rows) of the second layer ($H_{LAYER2}$). Rather, they might correspond to, for example, the third set of 24 parity-check equations. During the second clock cycle, the second set of 24 hard decisions $\hat{x}_n$, which correspond to the second set of 24 columns, might, for example, correspond to the fifth set of 24 parity-check equations (i.e., rows) of the second layer ($H_{LAYER2}$). During the third clock cycle, the third set of 24 hard decisions $\hat{x}_n$, which correspond to the second set of 24 columns, might correspond to the third set of 24 parity-check equations (i.e., rows), the fifth set of 24 parity-check equations, or another set of 24 parity-check equations of the second layer ($H_{LAYER2}$). Thus, depending on the arrangement of the second layer ($H_{LAYER2}$), second branch 450 might not perform all 11 updates for each of the first 24 parity-check equations in 24 consecutive clocks. Rather, second branch 450 might jump around from one set of 24 parity-check equations to another set of 24 parity-check equations every clock cycle.

At the end of the initialization phase (i.e. the first 1375 clocks), the exemplary hard-decision LDPC decoder 400 has calculated the entire syndrome (by using additional OR gates and a control circuit not shown in FIG. 4). In case the syndrome is 0, the decoding is complete and the hard-outputs can be read from the data memory 404.

Branches 440, 450, 460, and 470 process the sets of 24 hard decisions $\hat{x}_n$ that they receive in the same general manner using a barrel shifter (i.e., 408-2, 408-3, 408-4, 24 XOR gates (i.e., 410(25)-(48), 410(49)-(72) and 410(73)-(96), and a memory (i.e., 412-2, 412-3, 412-4). For ease of discussion, the operation of branch 450 is described. This description may be extended to branches 460 and 470.

During each clock cycle, barrel shifter 408-2 cyclically shifts the set of 24 hard decisions $\hat{x}_n$ that it receives based on a cyclic-shift signal received from, for example, ROM 420. The cyclic-shift signal is based on the cyclic-shift factors of the sub-matrices of the second layer ($H_{LAYER2}$) of H-matrix 300. The 24 cyclically-shifted hard decisions $\hat{x}_n$ are applied to XOR gates 410(25)-(48) along with 24 parity-check bits stored in memory 412-2 to generate 24 updated parity-check bits that are subsequently stored in memory 412-2.

Memory 412-2, which stores 24×125 parity-check bits, one for each parity-check equation, has 125 addresses, one for each block row (i.e., set of 24 rows) of second layer ($H_{LAYER2}$) of H-matrix 300. Each address stores 24 parity-check bits, each corresponding to one parity-check equation (i.e., row) of the second layer ($H_{LAYER2}$). All 24×125 parity-check bits are stored because, as described above, branch 450 might perform the 11 updates for each of the parity-check equations in a random order rather than performing the 11 updates consecutively. The sets of 24 parity-check bits are read from and written to addresses of memory 412-2 provided by a controller and must be initialized to 0 during the first clock cycle.

Once all 11 updates have been performed for each of the 24×125 parity-check equations of branch 450 (or 440), the decoder 400 determines whether the 24×125 parity-check bits are equal to 0. In so doing, a controller may apply all 24×125 parity-check bits to an OR gate to generate a single-bit value. If the single-bit value is 1, then one or more of the 24×125 parity-check bits are equal to 1. In this case, the parity check is not satisfied for the second layer ($H_{LAYER2}$), and LDPC decoder 400 may need to perform another iteration to correctly decode the codeword. If the single-bit value is 0, then all of the 24×125 parity-check bits are equal to 0. In this case, the parity check is satisfied for the second layer ($H_{LAYER2}$). The same process is performed for layers three and four ($H_{LAYER3}$, $H_{LAYER4}$) of H-matrix 300 in parallel with layers one and two ($H_{LAYER1}$, $H_{LAYER2}$), and, if syndrome calculator determines that the parity-check bits for all four layers are satisfied, then decoding is complete. Otherwise, decoding continues for another iteration. Alternatively, the 24×125 parity-check bits can be applied to a 24-operand OR gate sequentially as follows: Whenever all 11 updates have been performed for a certain group of 24 parity checks, then apply these updated 24 parity checks to a 24-operand OR gate and check the single-bit value of the OR-gate.

The first iteration (which takes up to 1375 clocks) follows the initialization phase (which takes 1375 clocks). During the first clock cycle of the first iteration, the memories 412 output the 4×24 parity check values that are connected to the 24 first bit nodes. For each bit node, the Majority Logic determines if the node is connected to 3 or more unsatisfied checks (or to 2 or more). Each bit node that is connected to 3 or more unsatisfied checks will then be flipped, which is done by the 24 XOR gates connected to the output of the data memory. In addition, the parity check equation of each flipped bit will be updated instantly and the new values are written back into the memories 412.

In addition, whenever the parity check equations are updated, the syndrome is instantly updated as well. Once the syndrome is 0, the decoding is complete and the procedure can be stopped, even if we haven't completed the entire first iteration. This feature supports high throughput and low latency of the decoder This procedure is repeated for all 33000 bits, which takes 33000/24 clock cycles. In addition, the procedure is repeated for multiple iterations, until the syndrome is 0, or until a certain maximum number of iterations has been reached.

Figure 5:
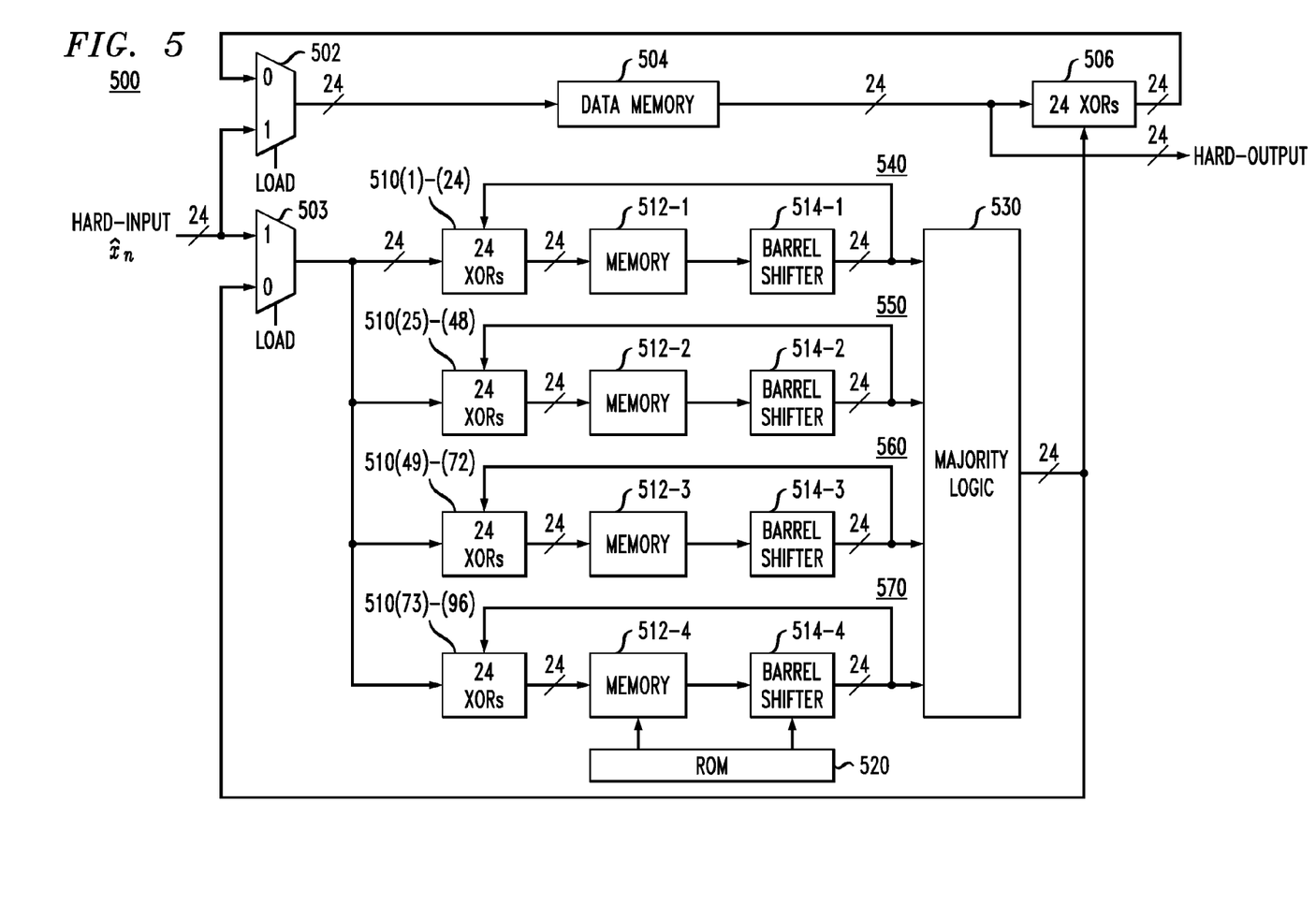
FIG. 5 is a block diagram for an exemplary hard-decision LDPC decoder according to an alternate embodiment of the present invention.

FIG. 5 is a block diagram for an exemplary hard-decision LDPC decoder 500 according to an alternate embodiment that requires only four barrel-shifters (instead of 8 barrel-shifters in FIG. 4). FIG. 5 uses different shift values than FIG. 1. The multiplexers, data memory, XOR gates, memories dual-port register files), ROM and majority logic of FIG. 5 operate in a similar manner to the corresponding elements in FIG. 4, as described above.

In the embodiment of FIG. 4, each branch 440, 450, 460, 470 comprise two barrel shifters 408, 414. In the embodiment of FIG. 5, each branch 440, 450, 460, 470 comprise a single barrel shifter 514 that performs the same amount of barrel shifting in a single step. Thus, in FIG. 4, if the first barrel shifter 408 shifted by two and the second barrel shifter 414 shifted by 3, the barrel shifter 514 of FIG. 5 shifts by 5.

It will be further understood that various changes in the details, materials, and arrangements of the parts which have been described and illustrated in order to explain the nature of this invention may be made b those skilled in the art without departing from the scope of the invention as expressed in the following claims. Although one embodiment has been described for each block of hardware of LDPC decoder 400 of FIG. 4, the present invention is not limited to those embodiments. As described above, various embodiments of the first layer ($H_{LAYER1}$) of H-matrix 300 may be envisioned that support processing of bit values without having to wait for all of the bit values to be generated. As an example, various embodiments may be envisioned in which groups of 11 identity matrices are not arranged along the diagonal as is shown in FIG. 3B, but rather, are arranged more randomly. For example, the identity matrices corresponding to block columns 1 to 11 may be located in block row 5, the eleven identity matrices corresponding to block columns 2 to 22 may be located in block row 8, the eleven identity matrices corresponding to block columns 23 to 33 may be located in block row 1, and so on. In such embodiments, the LDPC decoder processes the check nodes (i.e., rows) in a more-random fashion (e.g., performs the check node updates for block row 5, followed by block row 8, followed by block row 1, and so on).

As another example, the eleven identity matrices in each block row may be separated by, for example, zero matrices. For example, the eleven identity matrices in the first block row may be located in block columns 1, 3, . . . , 21, with zero matrices in block columns 2, 4, . . . , 22, and the eleven identity matrices in the second block row may be located in block columns 2, 4, . . . , 22, with zero matrices in block columns 1, 3, . . . , 21. Such embodiments may require a buffer, for example, at the inputs of multiplexer 402.

As yet another example, various embodiments may be envisioned in which sub-matrices of the first layer ($H_{LAYER1}$) are implemented as circulants rather than identity matrices. Such embodiments may require additional hardware, such as an additional barrel shifter.

The present invention may be implemented for various H-matrices that are the same size as or a different size from H-matrix 300 of FIG. 3. For example, the present invention may be implemented for H-matrices in which the number of columns, block columns, rows, block rows, layers (including implementations having only one layer), messages processed per clock cycle, the size of the sub-matrices, the size of the layers, and/or the column and/or row hamming weights differ from that of H-matrix 300. In such embodiments, the number of XORs and/or barrel shifter and/or majority logics may vary according to the characteristics of the H-matrix.

While the present invention was described relative to its use with regular H-matrices (i.e., H-matrices wherein the hamming weights of all columns are the same and the hamming weight of all rows are the same), the present invention is not so limited. The present invention may also be implemented for H-matrices that are irregular (i.e., H-matrices wherein the hamming weights of all columns are not the same and the hamming weight of all rows are not the same).

Further, the present invention is not limited to use with quasi-cyclic H-matrices. LDPC decoders of the present invention may be used with H-matrices that are either partially quasi-cyclic or fully non-cyclic. Partially quasi-cyclic LDPC codes are LDPC codes that comprise (i) one or more cyclic sub-matrices that are either equal to an identity matrix or are obtained by cyclically shifting an identity matrix and (ii) one or more non-cyclic sub-matrices that are not equal to an identity matrix and can not be obtained by cyclically shifting an identity matrix. LDPC codes that are fully non-cyclic do not have any cyclic sub-matrices. In various embodiments that employ either partially quasi-cyclic or fully non-cyclic H-matrices, the XORs, memories, and Majority logic may be interconnected using, for example, fixed connections or programmable cross-bars in lieu of barrel shifters.

Unless explicitly stated otherwise, each numerical value and range should be interpreted as being approximate as if the word "about" or "approximately" preceded the value of the value or range.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

I claim:

1. A hard-decision decoder for decoding one or more error-correcting (EC) codewords, said decoder comprising:
   a bit-flipping decoder that flips one or more bit nodes connected to one or more unsatisfied parity checks;
   a syndrome calculator that performs a parity check to determine whether said bit-flipping decoder has converged on a valid codeword, wherein said bit-flipping decoder and said syndrome calculator share one or more logic elements; and
   an update branch that updates one or more parity check equations associated with said one or more bit nodes each time said one or more bit nodes are flipped.

2. The decoder of claim 1, wherein said bit-flipping decoder is based on a variation of the Gallagher B algorithm.

3. The decoder of claim 1, wherein said bit-flipping decoder flips a bit if a substantial majority of parity check equations are unsatisfied.

4. The decoder of claim 1, wherein said bit-flipping decoder comprises one or more logic gates to perform said bit flipping.

5. The decoder of claim 4, wherein said one or more logic gates comprise one or more exclusive OR gates.

6. The decoder of claim 1, wherein said shared logic elements comprise one or more of cross connection circuit elements, exclusive OR gates and memory elements.

7. The decoder of claim 6, wherein said cross connection circuit elements comprise Barrel shifters.

8. The decoder of claim 6, further comprising:
   a memory that outputs a control signal to control the Barrel shifters.

9. The decoder of claim 1, wherein an iterative operation of said decoder terminates based on a predefined output of said syndrome calculator.

10. A method for decoding one or more error-correcting (EC) codewords, said method comprising:
    flipping one or more bit nodes connected to one or more unsatisfied parity checks; and
    updating one or more parity check equations associated with said one or more bit nodes each time said one or more bit nodes are flipped.

11. The method of claim 10, wherein said updating step updates said one or more parity check equations whenever a bit is updated.

12. The method of claim 10, wherein said flipping step is based on a variation of the Gallagher B algorithm.

13. The method of claim 10, wherein said flipping step flips a bit if a substantial majority of parity check equations are unsatisfied.

14. The method of claim 10, wherein said method terminates based on a predefined syndrome output.

15. A method for decoding one or more error-correcting (EC) codewords, said method comprising:
    flipping one or more bit nodes connected to one or more unsatisfied parity checks using a bit-flipping decoder;
    performing a parity check to determine whether said bit-flipping decoder has converged on a valid codeword, wherein said flipping step and said performing step use one or more common logic elements; and
    updating one or more parity check equations associated with said one or more bit nodes each time said one or more bit nodes are flipped.

16. The method of claim 15, wherein said flipping step is based on a Gallagher B algorithm.

17. The method of claim 15, wherein said flipping step flips a bit if a substantial majority of parity check equations are unsatisfied.

18. The method of claim 15, wherein said flipping step employs one or more logic gates to perform said bit flipping.

19. The method of claim 18, wherein said one or more logic gates comprise one or more exclusive OR gates.

20. The method of claim 15, wherein said common logic elements comprise one or more of cross connection circuit elements, exclusive OR gates and memory elements.

21. The method of claim 20, further comprising:
    a memory that outputs a control signal to control the one or more cross connection circuit elements, wherein the one or more cross connection circuit elements comprise Barrel shifters.

22. The method of claim 15, wherein said method terminates based on a predefined output of said syndrome calculator.

* * * * *